United States Patent
Furukawa

[11] Patent Number: 6,017,797
[45] Date of Patent: Jan. 25, 2000

[54] METHOD OF FABRICATING A SEMICONDUCTOR DEVICE INCLUDING COMPLEMENTARY MOSFET AND POWER MOSFET

[75] Inventor: Akio Furukawa, Tokyo, Japan

[73] Assignee: NEC Corporation, Tokyo, Japan

[21] Appl. No.: 09/075,821

[22] Filed: May 12, 1998

[30] Foreign Application Priority Data

May 12, 1997 [JP] Japan ................................ 9-121077

[51] Int. Cl.⁷ .............................................. H01L 21/8234
[52] U.S. Cl. ...................... 438/275; 438/200; 438/209; 438/279; 438/286; 148/DIG. 126
[58] Field of Search .................................. 438/200, 209, 438/275, 286, 279, FOR 216; 148/DIG. 126

[56] References Cited

U.S. PATENT DOCUMENTS

| | | | |
|---|---|---|---|
| 4,516,313 | 5/1985 | Turi et al. ................................... | 29/571 |
| 4,806,500 | 2/1989 | Scheibe ....................................... | 437/57 |
| 4,818,719 | 4/1989 | Yeh et al. .................................... | 437/57 |
| 4,874,714 | 10/1989 | Eklund ........................................ | 437/39 |
| 5,024,960 | 6/1991 | Kaken ......................................... | 437/34 |
| 5,340,756 | 8/1994 | Nagayasu .................................... | 437/34 |

FOREIGN PATENT DOCUMENTS 2-58371  2/1990  Japan .

OTHER PUBLICATIONS

Huang, Q., "Monolithic integration of . . . high–voltage devices", IEEE Electron Device Letters, pp. 575–577, vol. 13, Issue 11, Nov. 1992.

*Primary Examiner*—Wael M. Fahmy
*Assistant Examiner*—Long Pham
*Attorney, Agent, or Firm*—Sughrue, Mion, Zinn, Macpeak & Seas, PLLC

[57] ABSTRACT

There is provided a method of fabricating a semiconductor device including, a first conductivity type MOSFET, a second conductivity type MOSFET, and a power MOSFET having a high breakdown voltage, and having a drain offset region formed in the substrate between the drain region and a channel region located below the gate electrode, and containing first conductivity type impurities therein at such a concentration that carriers are depleted in an operation of the semiconductor device, the method including the steps, in sequence, of (a) forming gate electrodes on the substrate in first, second and third regions where the first conductivity type MOSFET, the second conductivity type MOSFET, and the power MOSFET are to be fabricated, respectively, (b) introducing first conductivity type impurities into the substrate at such a concentration that carriers are depleted in an operation of the semiconductor device, (c) introducing first conductivity type impurities into the substrate with both the second region and a region where the drain offset region is to be formed being masked with a photoresist film, and (d) introducing second conductivity type impurities into the substrate with both the first and third regions being masked with a photoresist film. The first conductivity type impurities in the step (b) is lower in concentration than the second conductivity type impurities and the first conductivity type impurities in the step (c). The method makes it possible to form CMOS and a power MOSFET on a common substrate without increasing the number of steps of forming a mask or a photoresist film in comparison with a conventional method of fabricating CMOS.

43 Claims, 3 Drawing Sheets

METHOD OF FABRICATING A SEMICONDUCTOR DEVICE INCLUDING COMPLEMENTARY MOSFET AND POWER MOSFET

BACKGROUND OF THE INVENTION

1. Field of the Invention

The invention relates to a method of fabricating a semiconductor device, and more particularly to a method of fabricating a complementary type MOSFET (CMOS) and MOSFET having a high breakdown voltage on a common substrate.

Description of the Related Art

A mobile communication device such as a cellular phone includes a transistor for receiving signals, and a transistor for supplying electric power to an antenna for transmitting signals after transmission signals have been established. A transistor to operate in a low frequency band of MHz band is constituted in the form of a complementary type MOS (CMOS) LSI, and a transistor to operate in a high frequency band of GHz band is constituted in the form of a bipolar transistor or a compound transistor alone, or in the form of a small-scale IC where a bipolar transistor or a compound transistor is integrated.

Recently, CMOS has been fabricated smaller and smaller. Hence, CMOS is now able to be employed as a transistor which operates in a high frequency band of GHz band, in which case, it is also possible to fabricate a transistor which originally operates in a high frequency band, in the form of CMOS, and it is further possible to form them on a common substrate.

When a transistor which operates in a high frequency band is to be fabricated in the form CMOS, in particular, when CMOS and MOSFET which needs to have a high breakdown voltage (hereinafter, such MOSFET is referred to as "power MOSFET") are fabricated on a common substrate, there is a problem that it is not possible to apply CMOS structure to power MOSFET. That is, power MOSFET has to have a different structure from CMOS in order to have a high breakdown voltage.

Figure 1:
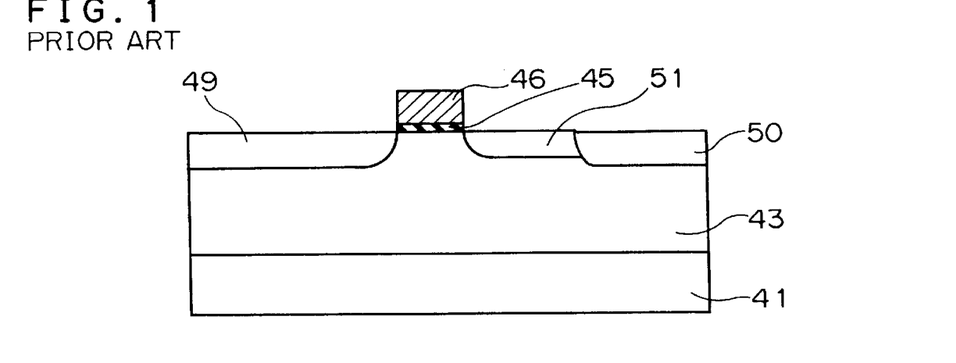
FIG. 1 is a cross-sectional view of power MOSFET.

FIG. 1 is a cross-sectional view illustrating an example of power MOSFET. The illustrated power MOSFET is comprised of a semiconductor substrate 41, a p-type well 43 formed in the semiconductor substrate 41, an n-type source region 49 and an n-type drain region 50 both formed at a surface of the semiconductor substrate 41, a gate insulating film 45 formed on the substrate 41 between the source and drain regions 49 and 50, a gate electrode 46 formed on the gate insulating film 45, and a drain offset region 45 formed in the substrate 41 between the n-type drain region 50 and a channel region to be formed below the gate electrode 46. The drain offset region 51 contains n-type impurities therein at a concentration low enough for carriers to be depleted while a semiconductor device is in operation. A voltage between the source and drain regions 49 and 50 is partially absorbed into the drain offset region 51. Thus, power MOSFET is different from ordinary CMOS in that power MOSFET has the drain offset region 51 for making a breakdown voltage thereof higher.

Japanese Unexamined Patent Publication No. 2-58371 has suggested a semiconductor device including CMOS and power MOSFET both integrated on a common semiconductor substrate. In the suggested semiconductor device, CMOS is designed to have a p-type gate, and power MOSFET is designed to have an n-type gate. Gate patterning is carried out separately for CMOS and power MOSFET. In addition, power MOSFET is of a vertical type, in which a source region is formed adjacent to a gate electrode, and a drain region is formed below a channel region.

Figure 2A:
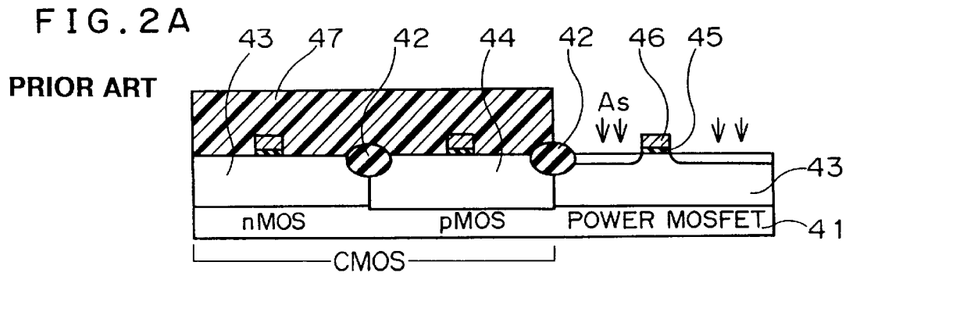
FIGS. 2A to 2C are cross-sectional views illustrating respective steps of a conventional method of fabricating CMOS.
Figure 2B:
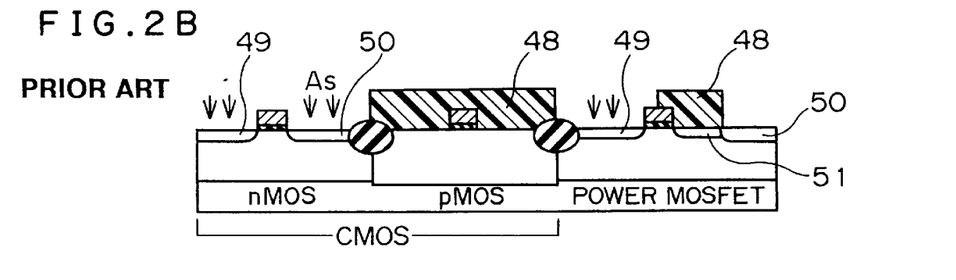
Figure 2C:
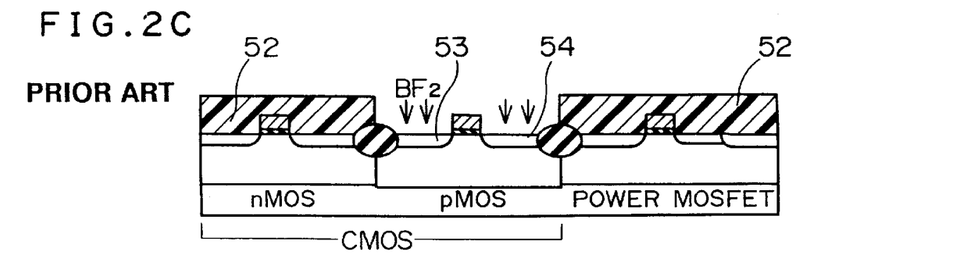

FIGS. 2A to 2C are cross-sectional views illustrating respective steps of a method of integrating a horizontal type power MOSFET and CMOS on a common semiconductor substrate. This method readily occurs to those skilled in the art n the analogy of a structure of power MOSFET and a conventional method of fabricating CMOS.

First, as illustrated in FIG. 2A, there is formed an insulating film 42 at a surface of a semiconductor substrate 41 for separating regions from one another where a semiconductor device is to be formed. Then, p-type wells 43 are formed in the semiconductor substrate 41 in regions where n-type MOSFET and power MOSFET are to be fabricated, and an n-type well 44 is formed in a region where p-type MOSFET is to be fabricated. Then, a gate insulating film 45 is formed on the semiconductor substrate 41, and gate electrodes 46 are formed on the gate insulating film 45.

Then, first and second region of the semiconductor substrate 41 where the n-type MOSFET and the p-type MOSFET are to be fabricated are covered with a photoresist film 47, followed by arsenic (As) ion-implantation into the semiconductor substrate 41 at a dose of $5\times10^{12}$ cm$^{-2}$ for the formation of a drain offset region 51 at a surface of the semiconductor substrate 41.

Then, as illustrated in FIG. 2B, the second region and the drain offset region 51 of the power MOSFET are covered with a photoresist film 48, followed by arsenic ion-implantation into the semiconductor substrate 41 at a dose of $1\times10^{15}$ cm$^{-2}$ for the formation of source and drain regions 49 and 50 both in the n-type MOSFET and the power MOSFET. The photoresist film 48 keeps the drain offset region 51 of the power MOSFET at a low concentration of impurities.

Then, as illustrated in FIG. 2C, the first region and a third region where the power MOSFET is to be formed are covered with a photoresist film 52, followed by boron (B) ion-implantation into the semiconductor substrate 41 at a dose of $1\times10^{15}$ cm$^{-2}$ for the formation of source and drain regions 53 and 54 of the p-type MOSFET.

Thereafter, though not illustrated, contacts and wiring layers are formed, and thus, there is completed a semiconductor device.

As mentioned earlier, in the method suggested in Japanese unexamined Patent Publication No. 2-58371 for integrating a vertical type power MOSFET and CMOS on a common semiconductor substrate, gate patterning is carried out separately for power MOSFET and CMOS. Accordingly, the number of steps of using a mask and a photoresist film is increased.

In addition, since a drain electrode in power MOSFET does not appear on the semiconductor substrate 41, it is quite difficult to make electrical connection between the drain electrode and a wiring layer at an upper surface of the semiconductor substrate unlike an ordinary CMOS logic circuit.

Though the above-mentioned Publication does not mention how a wire and a drain electrode are electrically connected to each other, those skilled in the art would select one of the following two methods: a wire is extended to a lower surface of the semiconductor substrate just below power MOSFET, and is electrically connected to a drain electrode; and, a hole reaching a drain electrode is formed in the semiconductor substrate, and the hole is filled with low-resistive material such as metal to thereby electrically connect a wire to the drain electrode. However, even if whichever method is selected, there is paused a problem that complicated steps have to be carried out for electrically connecting a wire to a drain electrode.

The method of integrating a horizontal type power MOSFET and CMOS on a common substrate, as illustrated in FIGS. 2A to 2C, has to include the greater number of steps of forming a mask and a photoresist film than an ordinary method of fabricating CMOS for formation of a drain offset region and also for ion-implantation into a semiconductor substrate.

SUMMARY OF THE INVENTION

In view of the above-mentioned problem of the conventional methods, it is an object of the present invention to provide a method of integrating power MOSFET and CMOS on a common semiconductor substrate without increasing the number of steps of using a mask and a photoresist film.

There is provided a method of fabricating a semiconductor device including: a first conductivity type MOSFET having a gate electrode formed on a substrate, and source and drain regions formed in the substrate; a second conductivity type MOSFET having a gate electrode formed on the substrate, and source and drain regions formed in the substrate; and a power MOSFET having a high breakdown voltage, and having a gate electrode formed on the substrate, source and drain regions formed in the substrate, and a drain offset region formed in the substrate between the drain region and a channel region located below the gate electrode, the drain offset region containing first conductivity type impurities therein at such a concentration that carriers are depleted in an operation of the semiconductor device, the method including the steps, in sequence, of (a) forming gate electrodes on the substrate in first, second and third regions where the first conductivity type MOSFET, the second conductivity type MOSFET, and the power MOSFET are to be fabricated, respectively, (b) introducing first conductivity type impurities into the substrate at such a concentration that carriers are depleted in an operation of the semiconductor device, (c) introducing first conductivity type impurities into the substrate with both the second region and a region where the drain offset region is to be formed being masked with a photoresist film, and (d) introducing second conductivity type impurities into the substrate with both the first and third regions being masked with a photoresist film. The first conductivity type impurities in the step (b) are lower in concentration than the second conductivity type impurities and the first conductivity type impurities in the step (c).

In accordance with the above-mentioned method, first conductivity type impurities are ion-implanted at a low concentration entirely into a semiconductor substrate for formation of a drain offset region of power MOSFET in order to avoid an increase in the number of steps of employing a mask and a photoresist film relative to an ordinary CMOS fabrication process. Accordingly, in accordance with the present invention, only a step of ion-implantation of impurities into a semiconductor substrate is increased relative to an ordinary CMOS fabrication process. Since first conductivity type impurities are ion-implanted wholly into a semiconductor substrate, the first conductivity type impurities are introduced into source and drain regions of a second conductivity type MOSFET, though such impurities are not to be contained in source and drain regions of the second conductivity type MOSFET. However, since the first conductivity type impurities are lower in concentration than second conductivity type impurities to be ion-implanted into source and drain regions of the second conductivity type MOSFET, the first conductivity type impurities do not exert any harmful influence on the second conductivity type MOSFET.

The above-mentioned method includes the steps of (b) introducing first conductivity type impurities into the substrate at such a concentration that carriers are depleted in an operation of the semiconductor device, (c) introducing first conductivity type impurities into the substrate with both the second region and a region where the drain offset region is to be formed being masked with a photoresist film, and (d) introducing second conductivity type impurities into the substrate with both the first and third regions being masked with a photoresist film. These three steps (b), (c) and (d) may be carried out in any order, because these three steps are independent from one another, and hence do not exert any influence on one another. Accordingly, these three steps may be carried out in one of the following six orders: (b), (c) and (d); (b), (d) and (c); (c), (b) and (d); (c), (d) and (b); (d), (b) and (c); and (d), (c) and (b).

Power MOSFET is driven with a voltage in the range of 2 to 5 V being applied to a drain region. In actual operation of a semiconductor device, a voltage about three times greater than a designed voltage is instantaneously applied to a part of a drain region. It is required for power MOSFET not to be degraded by such a voltage. Thus, power MOSFET is formed with a drain offset region in order to drop a voltage so that a voltage higher than a certain voltage is not applied to a channel region of power MOSFET. Hence, carriers have to be depleted in the drain offset region when a drain voltage is applied to a drain region. If a carrier concentration is too low, a carrier current is unpreferably reduced. Thus, the first conductivity type impurities to be ion-implanted into the semiconductor substrate in the step (b) are preferably designed to have a concentration in the range of $5 \times 10^{16}$ $cm^{-3}$ and $5 \times 10^{17}$ $cm^{-3}$, more preferably, in the range of $1 \times 10^{17}$ $cm^{-3}$ and $3 \times 10^{17}$ $cm^{-3}$.

The first conductivity type impurities to be ion-implanted into the semiconductor substrate in the step (c) are designed to have such a concentration as source and drain regions of the first conductivity type MOSFET properly operate. Specifically, it is preferable that the first conductivity type impurities in the step (c) have such a concentration that the source and drain regions of the first conductivity type MOSFET have a resistance which is smaller than a value of about 10% of a total resistance of the first conductivity type MOSFET. Specifically, the first conductivity type impurities to be ion-implanted into the semiconductor substrate in the step (c) is preferably designed to have a concentration in the range of $5 \times 10^{18}$ $cm^{-3}$ and $1 \times 10^{20}$ $cm^{-3}$, and more preferably in the range of $1 \times 10^{19}$ $cm^{-3}$ and $1 \times 10^{20}$ $cm^{-3}$.

The second conductivity type impurities to be ion-implanted into the semiconductor substrate in the step (d) are designed to have such a concentration as source and drain regions of the second conductivity type MOSFET properly operate. Specifically, it is preferable that the second conductivity type impurities in the step (d) have such a concentration that the source and drain regions of the second conductivity type MOSFET have a resistance which is smaller than a value of about 10% of a total resistance of the second conductivity type MOSFET. Specifically, the second conductivity type impurities to be ion-implanted into the semiconductor substrate in the step (d) is preferably designed to have a concentration in the range of $5 \times 10^{18}$ $cm^{-3}$ and $1\times10^2$ $cm^{-3}$, and more preferably in the range of $1\times10^{19}$ $cm^{-3}$ and $1\times10^2$ $cm^{-3}$.

The photoresist film covering a region where the drain offset region is to be formed may be formed so as to have an end located on the gate electrode.

There is further provided a method of fabricating a semiconductor device including: a first conductivity type MOSFET having a gate electrode formed on a substrate, and source and drain regions formed in the substrate; a second conductivity type MOSFET having a gate electrode formed on the substrate, and source and drain regions formed in the substrate; and a power MOSFET having a high breakdown voltage, and having a gate electrode formed on the substrate, source and drain regions formed in the substrate, and a drain offset region formed in the substrate between the drain region and a channel region located below the gate electrode, the drain offset region containing first conductivity type impurities therein at such a concentration that carriers are depleted in an operation of the semiconductor device, the method including the steps, in sequence, of (a) forming gate electrodes on the substrate in first, second and third regions where the first conductivity type MOSFET, the second conductivity type MOSFET, and the power MOSFET are to be fabricated, respectively, (b) introducing first conductivity type impurities into the substrate with the second region being masked with a photoresist film, and (c) introducing second conductivity type impurities into the substrate with both the first region and the third region except a region where the drain offset region is to be formed being masked with a photoresist film. Each of the first and second conductivity type impurities has such a concentration that the drain offset region is of a second conductivity type so that carriers are depleted in an operation of the semiconductor device.

In accordance with the above-mentioned method, the drain offset region, that is, a lightly impurity-doped layer, of the power MOSFET is formed by utilizing complementarity between first and second conductivity type impurities in such a manner that the first conductivity impurities are slightly greater in concentration than the second conductivity type impurities, in order to avoid an increase in the number of steps of using a mask and a photoresist film in comparison with an ordinary CMOS process. That is, source and drain regions of both the power MOSFET and the first conductivity type MOSFET are formed by ion-implantation of first conductivity type impurities, whereas source and drain regions of the second conductivity type MOSFET is formed by ion-implantation of second conductivity type impurities. By forming the source and drains in such a manner, the drain offset region of the power MOSFET becomes slight first conductivity type in such a degree as carriers are depleted, due to complementarity between the first and second conductivity type impurities. Thus, it is possible to integrate power MOSFET and CMOS on a common semiconductor substrate without an increase in the number of steps of using a mask and a photoresist film.

The steps (b) and (c) may be carried out in any order, because these steps are independent from each other, and hence do not exert any influence on each other. Hence, the step (b) may be carried out prior to the step (c), and vice versa.

The first and second conductivity type impurities to be ion-implanted into the semiconductor substrate in the steps (b) and (c) are designed to have such a concentration as source and drain regions of the first and second conductivity type MOSFETs properly operate. Specifically, it is preferable that the first and second conductivity type impurities in the steps (b) and (c) have such a concentration that the source and drain regions of first and the second conductivity type MOSFETs have a resistance which is smaller than a value of about 10% of a total resistance of the first and second conductivity type MOSFETs, respectively. In addition, the source and drain regions of first and the second conductivity type MOSFETs are designed to have such a concentration that the drain offset region of the power MOSFET becomes slight first conductivity type in such a degree as carriers are depleted in an operation of a semiconductor device, due to complementarity between the first and second conductivity type impurities. Thus, in light of the above-mentioned matters, the first and second conductivity type impurities to be ion-implanted into the semiconductor substrate in the steps (b) and (c) are preferably designed to have a concentration in the range of $5\times10^{18}$ $cm^{-3}$ and $1\times10^{20}$ $cm^{-3}$, and more preferably in the range of $1\times10^{19}$ $cm^{-3}$ and $1\times10^{20}$ $cm^{-3}$, and in addition, the second conductivity type impurities are preferably designed to have a concentration smaller than that of the first conductivity type impurities by about $5\times10^{16}$ $cm^{-3}$ to about $5\times10^{17}$ $cm^{-3}$.

It is preferable that a sidewall is formed around each of the gate electrodes before carrying out ion-implantation into the semiconductor substrate. By forming an insulating sidewall around the gate electrodes, it would be possible to prevent impurities from reaching a region located below the gate electrodes.

In the above-mentioned method, introduction of impurities into the substrate may be carried out by plasma enhanced doping or ion-implantation. In the plasma enhanced doping, impurities are turned into plasma condition, and then are introduced into a substrate. The plasma enhanced doping makes it possible to introduce impurities into a substrate in lower energy than ion-implantation.

For instance, the first conductivity type may be n-type and second conductivity type may be p-type, and vice versa. As n-type impurities, there may be used phosphorus, arsenic or antimony. As p-type impurities, there may be used boron, indium or $BF_2$.

In accordance with the above-mentioned methods, it is possible to integrate CMOS and power MOSFET on a common substrate without an increase in the number of steps of using a mask and a photoresist film in comparison with an ordinary method of fabricating CMOS.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

The first embodiment in accordance with the present invention is explained hereinbelow with reference to FIGS. 3A to 3E.

Figure 3A:
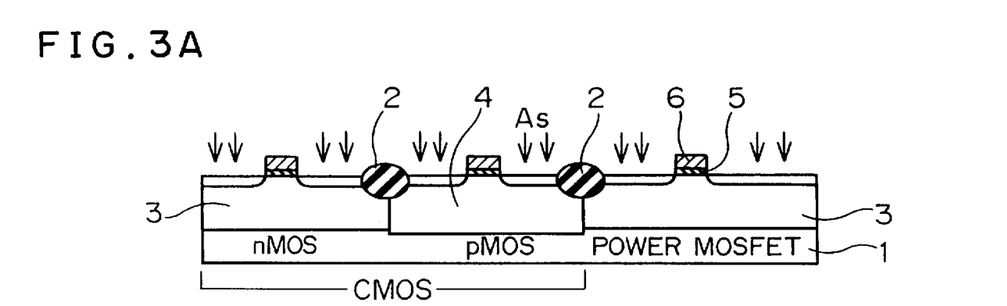
FIGS. 3A to 3E are cross-sectional views illustrating respective steps of a method in accordance with the first embodiment of the present invention.

First, as illustrated in FIG. 3A, there is formed an insulating film 2 at a surface of a p-type silicon substrate 1 for separating regions from one another where a semiconductor device is to be formed. The p-type silicon substrate 1 contains p-type impurities at $1\times10^{14}$ cm$^{-3}$. Then, p-type wells 3 are formed in the p-type silicon substrate 1 in first and third regions where n-type MOSFET and power MOSFET are to be fabricated, and an n-type well 4 is formed in a second region where p-type MOSFET is to be fabricated. Then, ions are introduced into the substrate 1 for formation of a channel. Then, a 5 nm-thick gate insulating film 5 composed of silicon dioxide, and a 200 nm-thick polysilicon film are deposited on the substrate 1, followed by application of a photoresist film (not illustrated) onto the substrate 1, exposure of the photoresist film to light, development of the photoresist film, and etching of the developed photoresist film, to thereby form a gate electrode 6 in each of the first to third regions.

Then, arsenic is ion-implanted entirely over the silicon substrate 1 at an acceleration energy of 20 keV with a dose of $5\times10^{12}$ cm$^{-2}$, followed by annealing at a suitable temperature. As a result, there are formed layers having a thickness of about 50 nm and containing arsenic therein at about $1\times10^{17}$ cm$^{-3}$ in both the gate electrodes 6 and regions where source and drain regions of the n-type, p-type and power MOSFETs are to be formed.

Figure 3B:
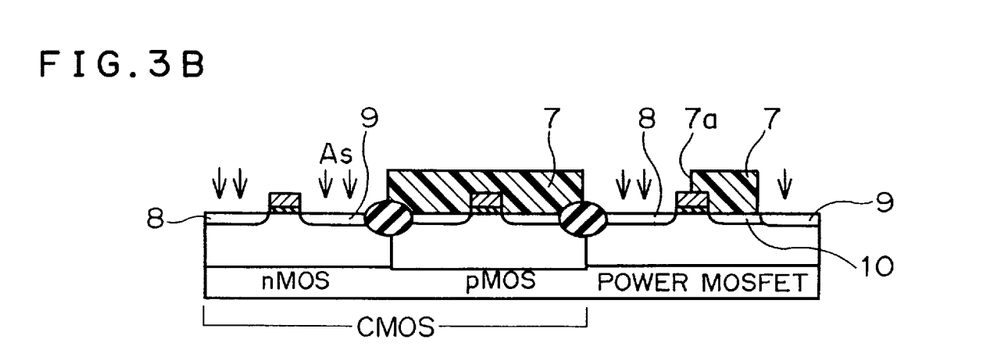

Then, as illustrated in FIG. 3B, the second region and a region where a drain offset region 10 of the power MOSFET is to be formed are covered with a photoresist film 7, followed by arsenic ion-implantation into the silicon substrate 1 at an acceleration energy of 20 keV with a dose of $5\times10^{14}$ cm$^{-2}$. As a result, source regions 8 and drain regions 9 of the power MOSFET and the n-type MOSFET are formed at a thickness of about 100 nm at an arsenic concentration of about $1\times10^{19}$ cm$^{-3}$. The drain offset region 10 contains arsenic therein at a concentration of $1\times10^{17}$ cm$^{-3}$.

The photoresist film 7 covering the drain offset region 10 of the power MOSFET therewith may have an end 7a located on the gate electrode 6, because, even so, arsenic ions do not reach the drain offset region 10 in the arsenic ion-implantation. The end 7a of the photoresist film 7 may be located on a boundary between the gate electrode 6 and the drain offset region 10. After the arsenic ion-implantation, the photoresist film 7 is removed.

Figure 3C:
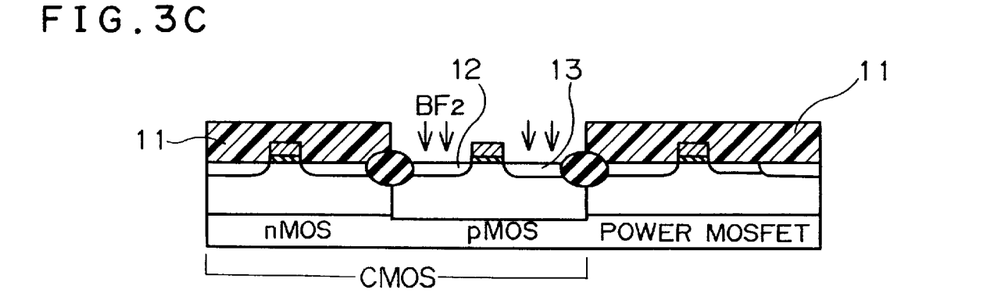

Then, as illustrated in FIG. 3C, the first region and the third region are covered with a photoresist film 11, followed by $BF_2$ ion-implantation into the silicon substrate 1 at an acceleration energy of 20 keV with a dose of $5\times10^{14}$ cm$^{-2}$. As a result, a source region 12 and a drain region 13 of the p-type MOSFET are formed at $BF_2$ concentration of about $1\times10^{19}$ cm$^{-3}$.

Figure 3D:
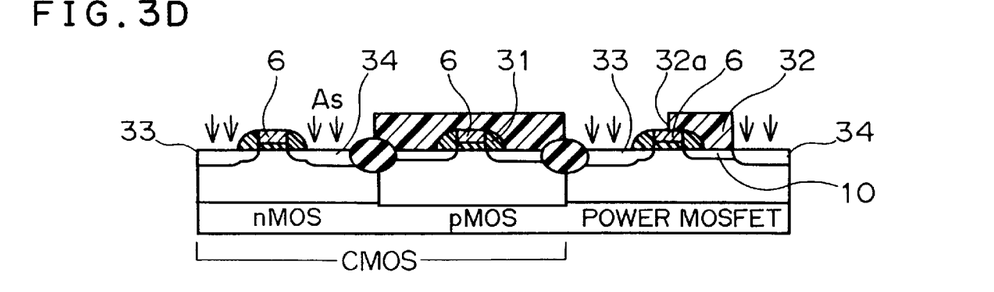

After removal of the photoresist film 11, as illustrated in FIG. 3D, a sidewall 31 is formed around each of the gate electrodes 6 of the n-type, p-type and power MOSFETs. The sidewall has a thickness of 100 nm. Then, the second region where the p-type MOSFET is to be formed and the drain offset region 10 are covered with a photoresist film 32, followed by arsenic ion-implantation into the silicon substrate 1 at an acceleration energy of 50 keV with a dose of $3\times10^{15}$ cm$^{-2}$. As a result, source regions 33 having a greater depth than the source region 8 and drain regions 34 having a greater depth than the drain region 9 are formed in the substrate 1 in the first and third regions.

Figure 3E:
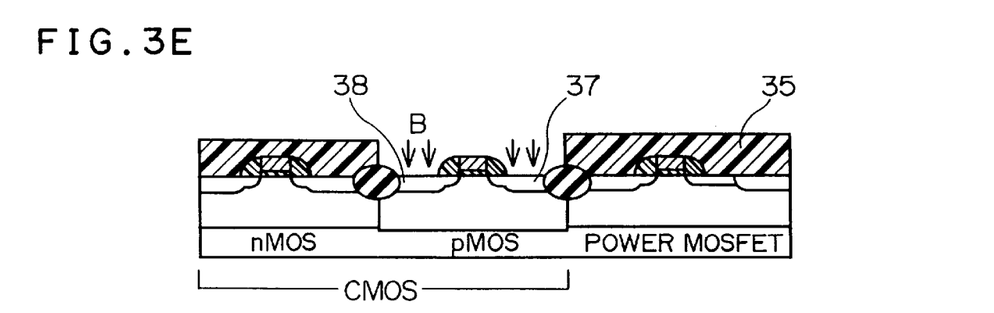

Then, as illustrated in FIG. 3E, the first and third regions are covered with a photoresist film 35, followed by boron ion-implantation into the silicon substrate 1 at an acceleration energy of 30 keV with a dose of $3\times10^{15}$ cm$^{-2}$. As a result, a source region 36 having a greater depth than the source region 12 and a drain region 37 having a greater depth than the drain region 13 are formed in the substrate 1 in the second region.

Then, the substrate 1 is annealed at 1,000° C. for 10 seconds for activation of the impurities introduced into the substrate 1.

In FIG. 3D, the photoresist film 32 covering the drain offset region 30 of the power MOSFET has an end 32a on a center of the gate electrode 6. If arsenic is intended to be introduced into the gate electrodes 6 by the ion-implantation to be subsequently carried out, it is preferable for the photoresist film 32 to have the end 32a located either on a boundary between the gate electrode 6 and the drain offset region 10, or on the gate electrode 6 but close to the boundary. If it is not necessary to introduce arsenic into the gate electrode 6, the photoresist film 32 may have the end 32a located on the gate electrode 6 anywhere.

Thereafter, contacts and wirings (neither illustrated) are formed. Thus, there is completed a semiconductor device.

In the instant embodiment, though the sidewall 31 is formed after the first ion-implantation illustrated in FIG. 3A has been carried out, the sidewall 31 may be formed before the first ion-implantation. By forming the sidewall 31 around the gate electrodes 6 before the first ion-implantation, it would be possible to prevent impurities from reaching a region located below the gate electrodes 6.

In accordance with the instant embodiment, only the step of ion-implantation entirely into the substrate 1 as illustrated in FIG. 3A is increased in comparison with a conventional method of fabricating CMOS, and the number of steps of using a mask and a photoresist film is not increased.

[Second Embodiment]

In the second embodiment, an order of the steps carried out in the above-mentioned first embodiment is changed. Now the steps illustrated in FIGS. 3A, 3B and 3C are called steps 1, 2 and 3, respectively. The steps 1 to 3 may be carried out in any one of the following orders.

1. step 1, step 2 and step 3 (This is just the same as the first embodiment illustrated in FIGS. 3A to 3C.)
2. step 1, step 3 and step 2
3. step 2, step 3 and step 1
4. step 2, step 1 and step 3
5. step 3, step 1 and step 2
6. step 3, step 2 and step 1

This is because the steps 1 to 3 are comprised of the introduction of impurities into the substrate and the formation of a photoresist film for masking the substrate, and are independent from one another, ensuring they do not exert any influence on one another.

[Third Embodiment]

The third embodiment in accordance with the present invention is explained hereinbelow with reference to FIGS. 4A and 4B.

Figure 4A:
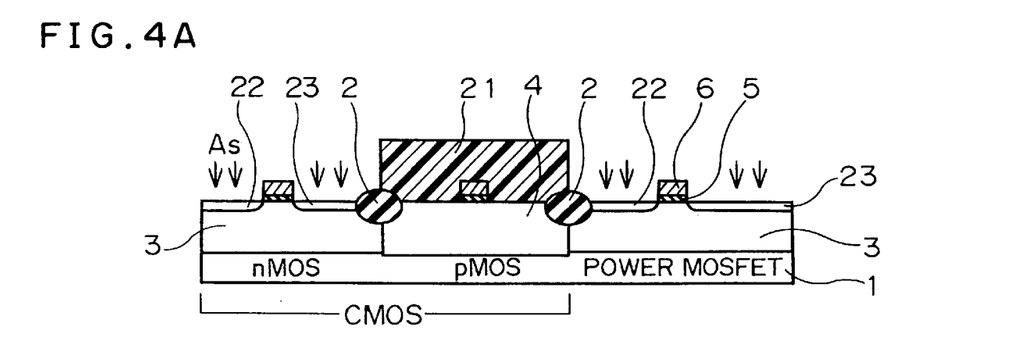
FIGS. 4A and 4B are cross-sectional views illustrating respective steps of a method in accordance with the third embodiment of the present invention.

First, as illustrated in FIG. 4A, there is formed an insulating film 2 at a surface of a p-type silicon substrate 1 for separating regions from one another where a semiconductor device is to be formed. The p-type silicon substrate 1 contains p-type impurities at about $1\times10^{14}$ cm$^{-3}$. Then, p-type wells 3 are formed in the p-type silicon substrate 1 in first and third regions where n-type MOSFET and power MOSFET are to be fabricated, and an n-type well 4 is formed in a second region where p-type MOSFET is to be fabricated. Then, ions are introduced into the substrate 1 for formation of a channel. Then, a 5 nm-thick gate insulating film 5 composed of silicon dioxide, and a 200 nm-thick polysilicon film are deposited on the substrate 1, followed by application of a photoresist film (not illustrated) onto the substrate 1, exposure of the photoresist film to light, development of the photoresist film, and etching of the developed photoresist film, to thereby form a gate electrode 6 in each of the first, second and third regions.

Then, the second region is covered with a photoresist film 21, followed by arsenic ion-implantation into the silicon substrate 1 at an acceleration energy of 20 keV with a dose of $5 \times 10^{14}$ cm$^{-2}$. As a result, source regions 22 and drain regions 23 of the n-type MOSFET and the power MOSFET are formed. The thus formed source and drain regions 22 and 23 have a thickness of about 100 nm and an arsenic concentration of about $1 \times 10^{19}$ cm$^{-2}$. After the arsenic ion-implantation, the photoresist film 21 is removed.

Figure 4B:
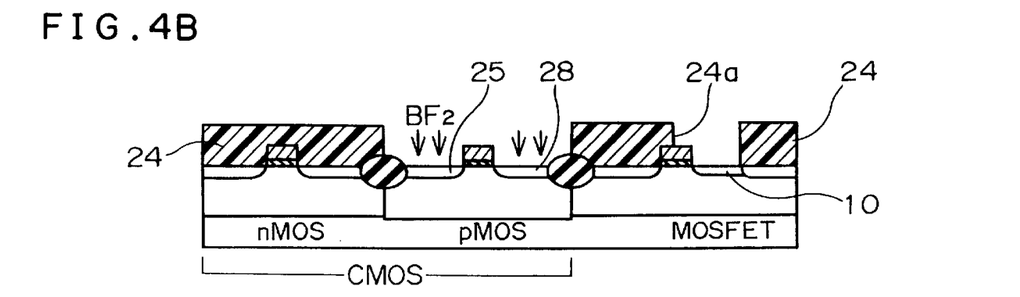

Then, as illustrated in FIG. 4B, the first region and the third region except a region where a drain offset region 10 is to be formed are covered with a photoresist film 24, followed by BF$_2$ ion-implantation into the silicon substrate 1 at an acceleration energy of 20 keV with a dose of $4.95 \times 10^{14}$ cm$^{-2}$. As a result, a source region 25 and a drain region 26 of the p-type MOSFET are formed at BF$_2$ concentration of about $1 \times 10^{19}$ cm$^{-3}$.

Since the dose ($4.95 \times 10^{14}$ cm$^{-2}$) at which BF$_2$ is ion-implanted is slightly smaller than the dose ($5 \times 10^{14}$ cm$^{-2}$) at which arsenic is ion-implanted, arsenic is set off with boron at about 95% in the drain offset region 10. As a result, arsenic contributing for generation of carriers remains at about $1 \times 10^{17}$ cm$^{-3}$, the carriers in the drain offset region 10 can be depleted.

The photoresist film 24 partially covering the third region therewith may have an end 24a on the gate electrode 6 anywhere, because BF$_2$ to be subsequently ion-implanted into the substrate 1 can reach the drain offset region 10 unless the photoresist film 24 extends to cover the drain offset region 10. The photoresist film 24 may have the end 24a located on a boundary between the gate electrode 6 and the drain offset region 10.

Thereafter, the steps as illustrated in FIGS. 3D and 3E are carried out to thereby form the deeper source regions 33 and 36 and the deeper drain regions 34 and 37. Then, contacts and wirings (neither illustrated) are formed. Thus, there is completed a semiconductor device.

The method in accordance with the third embodiment is different from a conventional method of fabricating CMOS in that a mask pattern further includes a pattern for covering the third region. Namely, a mask pattern is merely increased in an area. Hence, the number of steps of using a mask and a photoresist film is not increased in comparison with a conventional method of fabricating CMOS.

[Fourth Embodiment]

In the fourth embodiment, an order of the steps carried out in the above-mentioned third embodiment is changed. That is, the step explained with reference to FIG. 4B is first carried out, and thereafter the step explained with reference to FIG. 4A is carried out in the fourth embodiment.

First, there is formed the insulating film 2 at a surface of the p-type silicon substrate 1, and then, the p-type wells 3 are formed in the first and third regions, and the n-type well 4 is formed in the second region. Then, the gate electrodes 6 are formed in each of the first, second and third regions in the same manner as that of the third embodiment.

Then, as illustrated in FIG. 4B, the first region and the third region except a region where the drain offset region 10 is to be formed are covered with the photoresist film 24, followed by BF$_2$ ion-implantation into the silicon substrate 1 at an acceleration energy of 20 keV with a dose of $4.95 \times 10^{14}$ cm$^{-2}$. As a result, the source region 25 and the drain region 26 of the p-type MOSFET are formed at BF$_2$ concentration of about $1 \times 10^{19}$ cm$^{-3}$.

Then, as illustrated in FIG. 4A, the second region is covered with the photoresist film 21, followed by arsenic ion-implantation into the silicon substrate 1 at an acceleration energy of 20 keV with a dose of $5 \times 10^{14}$ cm$^{-2}$. As a result, the source regions 22 and the drain regions 23 of the n-type MOSFET and the power MOSFET are formed.

Since the dose ($4.95 \times 10^{14}$ cm$^{-2}$) at which BF$_2$ is ion-implanted is slightly smaller than the dose ($5 \times 10^{14}$ cm$^{-2}$) at which arsenic is ion-implanted, arsenic is set off with boron at about 95% in the drain offset region 10, and as a result, the drain offset region 10 is inverted into a lightly doped n-type region.

Thereafter, the steps as illustrated in FIGS. 3D and 3E are carried out to thereby form the deeper source regions 33 and 36 and the deeper drain regions 34 and 37. Then, contacts and wirings (neither illustrated) are formed. Thus, there is completed a semiconductor device.

[Fifth Embodiment]

In accordance with the fifth embodiment, the sidewall 31 illustrated in FIG. 3D is first formed around each of the gate electrodes 6, and thereafter the steps of the first embodiment are carried out. The sidewall 31 is composed of insulating material such as silicon dioxide and silicon nitride, and has a thickness of about 20 nm. If impurities are introduced into the silicon substrate 1 without forming the sidewall 31, the introduced impurities spread in the substrate 1 and reach below the gate electrode 6, resulting in that an effective gate length is unpreferably made shorter. By forming the sidewall 31 around the gate electrodes 6 before introduction of impurities into the substrate 1, it is possible to prevent the introduced impurities from reaching below the gate electrodes 6, which ensures a desired effective gate length.

[Sixth Embodiment]

Though the impurities such as arsenic and BF$_2$ are introduced into the substrate 1 by ion-implantation, the impurities may be introduced into the substrate 1 by plasma enhanced doping.

In plasma enhanced doping, He gas and 0.02% B$_2$H$_6$ or AsH$_3$ gas are mixed together. Then, the mixed gas is excited by ECR/RF plasma to thereby be put in plasma condition. The mixed gas in plasma condition is introduced onto the substrate 1, and kept to stay there for 100 seconds. As a result, boron or arsenic atoms are introduced into the substrate 1 at $5 \times 10^{14}$ cm$^{-2}$. When impurities are to be introduced into the substrate 1 at $5 \times 10^{12}$ cm$^{-2}$, there is employed 0.0002% B$_2$H$_6$ or AsH$_3$ gas which is diluted with He gas.

Impurities can be introduced into the substrate 1 by plasma enhanced doping at a lower energy than ion-implantation. Specifically, impurities are introduced into the substrate 1 by plasma enhanced doping at about 1 keV. The impurities to be introduced into the substrate 1 have the same concentration as those of the first embodiment.

Thereafter, the steps as illustrated in FIGS. 3D and 3E are carried out to thereby form the deeper source regions 33 and 36 and the deeper drain regions 34 and 37. Then, contacts and wirings (neither illustrated) are formed. Thus, there is completed a semiconductor device.

In the above-mentioned first to fifth embodiments, arsenic and BF$_2$ are employed as n- and p-type impurities, respectively. However, it should be noted that phosphorus or antimony may be employed as n-type impurities in place of arsenic, and that boron or indium may be employed as p-type impurities in place of $BF_2$.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-121077 filed on May 12, 1997 including specification, claims, drawings and summary is incorporated herein by reference in its entirety.

What is claimed is:

1. A method of fabricating a semiconductor device including: a first conductivity type MOFSET having a first gate electrode formed on a substrate, and first source and drain regions formed in said substrate; a second conductivity type MOSFET having a second gate electrode formed on said substrate, and second source and drain regions formed in said substrate; and a power MOSFET having a high breakdown voltage and having a third gate electrode formed on said substrate, third source and drain regions formed in said substrate, and a drain offset region formed in said substrate between said third drain region and a channel region located below said third gate electrode, said drain offset region containing first conductivity type impurities, said method comprising the steps of:

(a) forming said first, second, and third gate electrodes on said substrate in first, second, and third regions where said first conductivity type MOSFET, said second conductivity type MOSFET, and said power MOSFET are to be fabricated, respectively;

(b) introducing first conductivity type impurities into said first, second, and third regions of said substrate at such a concentration that carriers are depleted in an operation of said semiconductor device;

(c) masking said second region and a drain offset portion of said third region where said drain offset region is to be formed with a photoresist film and introducing first conductivity impurities into said first region and a non-drain offset portion of said third region where said drain offset region is not to be formed; and (d) masking said first and third regions with a photoresist film and introducing second conductivity type impurities into said second region.

2. The method as set forth in claim 1, wherein said first conductivity type is n-type, and second conductivity type is p-type.

3. The method as set forth in claim 1, wherein said step (b) is performed before said step (d) and said step (d) is performed before said step (c).

4. The method as set forth in claim 1, wherein said step (c) is performed before said step (b) and said step (b) is performed before said step (d).

5. The method as set forth in claim 1, wherein said step (c) is performed before said step (d) and said step (d) is performed before said step (b).

6. The method as set forth in claim 1, wherein said step (d) is performed before said step (b) and said step (b) is performed before said step (c).

7. The method as set forth in claim 1, wherein said step (d) is performed before said step (c) and said step (c) is performed before said step (b).

8. The method as set forth in claim 1, wherein said photoresist film covering said drain offset portion of said third region where said drain offset region is to be formed is formed so as to have an end located on an upper surface of said gate electrode.

9. The method as set forth in claim 1, wherein said first conductivity type impurities in said step (b) have a concentration in the range of $5\times10^{16}$ cm$^{-3}$ and $5\times10^{17}$ cm$^{-3}$.

10. The method as set forth in claim 1, wherein said first conductivity type impurities in said step (c) have such a concentration that said third source and drain regions of said power MOSFET have a resistance which is smaller than a value of about 10% of a resistance of said first source and drain regions and a channel of said first conductivity type MOSFET.

11. The method as set forth in claim 10, wherein said first conductivity type impurities in said step (c) have a concentration in the range of $5\times10^{18}$ cm$^{-3}$ and $1\times10^{20}$ cm$^{-3}$.

12. The method as set forth in claim 1, wherein said second conductivity type impurities have such a concentration that said third source and drain regions of said power MOSFET have a resistance which is smaller than a value of about 10% of a resistance of said second source and drain regions and a channel of said second conductivity type MOSFET.

13. The method as set forth in claim 12, wherein said second conductivity type impurities have a concentration in the range of $5\times10^{18}$ cm$^{-3}$ and $1\times10^{20}$ cm$^{-3}$.

14. The method as set forth in claim 1, further comprising the step of:

(e) forming a sidewall around each of said gate electrodes.

15. The method as set forth in claim 1, wherein introduction of said impurities into said substrate in said steps (b), (c) and (d) is carried out by ion-implantation.

16. The method as set forth in claim 1, wherein introduction of said impurities into said substrate in said steps (b), (c) and (d) is carried out by plasma enhanced doping.

17. The method as set forth in claim 1, wherein said first conductivity type impurities are selected from a group consisting of phosphorus, arsenic, and antimony.

18. The method as set forth in claim 1, wherein said second conductivity type impurities are selected from a group consisting of boron, indium, and $BF_2$.

19. A method of fabricating a semiconductor device including: a first conductivity type MOSFET having a first gate electrode formed on a substrate, and first source and drain regions formed in said substrate; a second conductivity type MOSFET having a second gate electrode formed on said substrate, and second source and drain regions formed in said substrate; and a power MOSFET having a high breakdown voltage and having a third gate electrode formed on said substrate, third source and drain regions formed in said substrate, and a drain offset region formed in said substrate between said third drain region and a channel region located below said third gate electrode, said drain offset region containing first conductivity type impurities, said method comprising the steps of:

(a) forming said first, second, and third gate electrodes on said substrate in first, second, and third regions where said first conductivity type MOSFET, said second conductivity type MOSFET, and said power MOSFET are to be fabricated, respectively;

(b) masking said second region with a photoresist film and introducing first conductivity type impurities into said first and third regions of said substrate; and (c) masking said first region and a non-drain offset portion of said third region where said drain offset region is not to be formed and introducing second conductivity type impurities into said second region and a drain offset portion of said third region where said drain offset region is to be formed.

20. The method as set forth in claim 19, wherein said first conductivity type is n-type, and second conductivity type is p-type.

21. The method as set forth in claim 19, wherein said step (c) is performed before said step (b).

22. The method as set forth in claim 19, wherein said first and second conductivity type impurities have such a concentration that said source and drain regions of said first and second conductivity type MOSFETs have a resistance which is smaller than a value of about 10% of a total resistance of said first and second conductivity type MOSFETs.

23. The method as set forth in claim 19, wherein said first conductivity type impurities have a concentration in the range of $5 \times 10^{18}$ cm$^{-3}$ and $1 \times 10^{20}$ cm$^{-3}$.

24. The method as set forth in claim 23, wherein said second conductivity type impurities have a concentration in the range of $5 \times 10^{18}$ cm$^{-3}$ and $1 \times 10^{20}$ cm$^{-3}$, and is smaller than a concentration of said first conductivity type impurities by $5 \times 10^{16}$ cm$^{-3}$ to $5 \times 10^{17}$ cm$^{-3}$.

25. The method as set forth in claim 19, further comprising the step of:

(e) forming a sidewall around each of said gate electrodes.

26. The method as set forth in claim 19, wherein introduction of said impurities into said substrate in said steps (b) and (c) is carried out by ion-implantation.

27. The method as set forth in claim 19, wherein introduction of said impurities into said substrate in said steps (b) and (c) is carried out by plasma enhanced doping.

28. The method as set forth in claim 19, wherein said first conductivity type impurities are selected from a group consisting of phosphorus, arsenic, and antimony.

29. The method as set forth in claim 19, wherein said second conductivity type impurities are selected from a group consisting of boron, indium, and BF$_2$.

30. The method as set forth in claim 1, wherein said step (b) is performed before step (c) and said step (c) is performed before said step (d).

31. The method as set forth in claim 14, wherein said step (e) is performed after said step (a) and before said step (b).

32. The method as set forth in claim 14, further comprising the steps of:

(f) masking said second region and said drain offset portion of said third region where said drain offset region is to be formed with a photoresist film after said sidewalls have been formed and introducing first conductivity impurities into said first region and said non-drain offset portion of said third region where said drain offset region is not to be formed; and (g) masking said first and third regions with a photoresist film after said sidewalls have been formed and introducing second conductivity type impurities into said second region.

33. The method as set forth in claim 32, wherein said step (f) is performed before said step (g).

34. The method as set forth in claim 32, wherein said step (g) is performed before said step (f).

35. The method as set forth in claim 1, wherein said first conductivity type impurities in said step (b) are lower in concentration than said second conductivity type impurities and said first conductivity type impurities in said step (c).

36. The method as set forth in claim 1, wherein said drain offset region contains first conductivity type impurities having such a concentration that carriers are depleted in an operation of said semiconductor device.

37. The method as set forth in claim 19, wherein said drain offset region contains first conductivity type impurities having such a concentration that carriers are depleted in an operation of said semiconductor device.

38. The method as set forth in claim 19, wherein each of said first and second conductivity type impurities has such a concentration that said drain offset region is of a second conductivity type so that carriers are depleted in an operation of said semiconductor device.

39. The method as set forth in claim 19, wherein said step (b) is performed before said step (c).

40. The method as set forth in claim 25, wherein said step (e) is performed after said step (a) and before said step (b).

41. The method as set forth in claim 25, further comprising the steps of:

(f) masking said second region and said drain offset portion of said third region where said drain offset region is to be formed with a photoresist film after said sidewalls have been formed and introducing first conductivity impurities into said first region and said non-drain offset portion of said third region where said drain offset region is not to be formed; and (g) masking said first and third regions with a photoresist film after said sidewalls have been formed and introducing second conductivity type impurities into said second region.

42. The method as set forth in claim 41, wherein said step (f) is performed before said step (g).

43. The method as set forth in claim 42, wherein said step (g) is performed before said step (f).

* * * * *